(12) United States Patent
Breitwisch (10) Patent No.: US 9,059,394 B2
(45) Date of Patent: Jun. 16, 2015

(54) SELF-ALIGNED LOWER BOTTOM ELECTRODE

(75) Inventor: Matthew J. Breitwisch, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 177 days.

(21) Appl. No.: 13/369,655

(22) Filed: Feb. 9, 2012

(65) Prior Publication Data

US 2012/0139119 A1 Jun. 7, 2012

Related U.S. Application Data

(62) Division of application No. 12/619,375, filed on Nov. 16, 2009, now Pat. No. 8,129,268.

(51) Int. Cl.
*H01L 45/00* (2006.01)
*H01L 27/24* (2006.01)

(52) U.S. Cl.
CPC .............. *H01L 45/06* (2013.01); *H01L 45/16* (2013.01); *H01L 27/2436* (2013.01)

(58) Field of Classification Search
CPC .................................................. H01L 23/5226
USPC ................. 257/E21.575, E21.576, E21.577, 257/E21.58, E21.583, E21.585; 438/618, 438/622, 626, 675
See application file for complete search history.

(56) References Cited

U.S. PATENT DOCUMENTS

| | | |
|---|---|---|
| 5,118,299 A | 6/1992 | Burns et al. |
| 5,687,112 A | 11/1997 | Ovshinsky |
| 5,789,277 A | 8/1998 | Zahorik et al. |
| 5,825,046 A | 10/1998 | Czubatyj et al. |
| 5,903,059 A | 5/1999 | Bertin et al. |
| 5,956,575 A | 9/1999 | Bertin et al. |
| 6,087,674 A | 7/2000 | Ovshinsky et al. |
| 6,150,253 A | 11/2000 | Doan et al. |
| 6,177,329 B1 * | 1/2001 | Pang ............................ 438/400 |
| 6,393,685 B1 | 5/2002 | Collins |

(Continued)

FOREIGN PATENT DOCUMENTS

| | | |
|---|---|---|
| EP | 1830362 A2 | 9/2007 |
| WO | 2009115995 A1 | 9/2009 |

OTHER PUBLICATIONS

U.S. Appl. No. 13/004,471; Non-Final Office Action; Date Filed: Jan. 11, 2011; Date Mailed: Jun. 8, 2012; pp. 1-21.

(Continued)

*Primary Examiner* — Yu-Hsi D Sun
(74) *Attorney, Agent, or Firm* — Cantor Colburn LLP; Vazken Alexanian (57) ABSTRACT

A method of fabricating a lower bottom electrode for a memory element and a semiconductor structure having the same includes forming a dielectric layer over a semiconductor substrate having a plurality of conductive contacts formed therein to be connected to access circuitry, forming a dielectric cap layer over exposed portions of the dielectric layer and the conductive contacts, depositing a planarizing material over the dielectric cap layer, etching a via to an upper surface of each conductive contact, removing the planarizing material, depositing electrode material over the dielectric cap layer and within the vias, the electrode material contacting an upper surface of each conductive contact, and planarizing the electrode material to form a lower bottom electrode over each conductive contact.

5 Claims, 8 Drawing Sheets

(56) References Cited

U.S. PATENT DOCUMENTS

| | | |
|---|---|---|
| 6,512,241 B1 | 1/2003 | Lai |
| 6,744,088 B1 | 6/2004 | Dennison |
| 6,750,469 B2 | 6/2004 | Ichihara et al. |
| 6,791,102 B2 | 9/2004 | Johnson et al. |
| 6,797,612 B2 | 9/2004 | Zahorik |
| 6,967,865 B2 | 11/2005 | Lee |
| 7,026,213 B1 | 4/2006 | Lee |
| 7,057,923 B2 | 6/2006 | Furkay et al. |
| 7,224,068 B2 * | 5/2007 | Tseng et al. ............ 257/774 |
| 7,324,365 B2 | 1/2008 | Gruening-von Schwerin et al. |
| 7,362,608 B2 | 4/2008 | Schwerin et al. |
| 7,394,088 B2 | 7/2008 | Lung |
| 7,397,060 B2 | 7/2008 | Lung |
| 7,423,300 B2 | 9/2008 | Lung et al. |
| 7,473,576 B2 | 1/2009 | Lung |
| 7,476,587 B2 | 1/2009 | Lung |
| 7,485,487 B1 | 2/2009 | Breitwisch et al. |
| 7,545,668 B2 | 6/2009 | Philipp et al. |
| 7,547,913 B2 | 6/2009 | Yoon et al. |
| 7,560,721 B1 | 7/2009 | Breitwisch et al. |
| 7,582,889 B2 | 9/2009 | Asano |
| 7,718,464 B2 | 5/2010 | Zaidi |
| 7,808,816 B2 | 10/2010 | Tanaka et al. |
| 7,863,593 B2 | 1/2011 | Happ et al. |
| 7,879,645 B2 | 2/2011 | Lung et al. |
| 7,927,911 B2 | 4/2011 | Breitwisch et al. |
| 7,943,420 B1 | 5/2011 | Breitwisch et al. |
| 8,012,790 B2 | 9/2011 | Breitwisch et al. |
| 8,017,930 B2 | 9/2011 | Philipp et al. |
| 8,030,130 B2 | 10/2011 | Breitwisch et al. |
| 8,115,239 B2 | 2/2012 | Lankhorst et al. |
| 8,189,372 B2 | 5/2012 | Breitwisch et al. |
| 8,513,640 B2 | 8/2013 | Morikawa et al. |
| 8,779,474 B2 | 7/2014 | Lankhorst et al. |
| 2001/0032702 A1 | 10/2001 | Feldman et al. |
| 2002/0023581 A1 | 2/2002 | Vodakov et al. |
| 2004/0077123 A1 | 4/2004 | Lee et al. |
| 2004/0179394 A1 | 9/2004 | Ovshinsky et al. |
| 2004/0195604 A1 | 10/2004 | Hwang et al. |
| 2005/0180191 A1 | 8/2005 | Xu |
| 2005/0263829 A1 | 12/2005 | Song et al. |
| 2006/0169968 A1 | 8/2006 | Happ |
| 2006/0175597 A1 | 8/2006 | Happ |
| 2006/0175599 A1 | 8/2006 | Happ |
| 2007/0010082 A1 | 1/2007 | Pinnow et al. |
| 2007/0018202 A1 | 1/2007 | Zhu |
| 2007/0029606 A1 | 2/2007 | Noh et al. |
| 2007/0034849 A1 | 2/2007 | Sandoval et al. |
| 2007/0108488 A1 | 5/2007 | Suh et al. |
| 2007/0155117 A1 | 7/2007 | Wicker |
| 2007/0158395 A1 | 7/2007 | Fasano et al. |
| 2007/0166981 A1 | 7/2007 | Furukawa et al. |
| 2007/0184233 A1 | 8/2007 | Meinders et al. |
| 2007/0197012 A1 | 8/2007 | Yang et al. |
| 2007/0246440 A1 | 10/2007 | Sato |
| 2007/0246782 A1 | 10/2007 | Philipp et al. |
| 2007/0249086 A1 | 10/2007 | Philipp et al. |
| 2007/0252127 A1 | 11/2007 | Arnold et al. |
| 2008/0023685 A1 | 1/2008 | Czubatyj et al. |
| 2008/0061341 A1 | 3/2008 | Lung |
| 2008/0137400 A1 | 6/2008 | Chen et al. |
| 2008/0138931 A1 | 6/2008 | Lung |
| 2008/0164452 A1 | 7/2008 | Joseph et al. |
| 2008/0178436 A1 | 7/2008 | Zhang et al. |
| 2008/0191187 A1 | 8/2008 | Lung et al. |
| 2008/0197333 A1 | 8/2008 | Lung |
| 2008/0203379 A1 | 8/2008 | Magistretti et al. |
| 2008/0246014 A1 | 10/2008 | Lung |
| 2008/0265234 A1 | 10/2008 | Breitwisch et al. |
| 2008/0265239 A1 | 10/2008 | Philipp et al. |
| 2008/0286446 A1 | 11/2008 | Kamepalli et al. |
| 2008/0316794 A1 | 12/2008 | Philipp et al. |
| 2009/0072216 A1 | 3/2009 | Lung et al. |
| 2009/0149006 A1 | 6/2009 | Kim |
| 2009/0185411 A1 | 7/2009 | Happ et al. |
| 2009/0196094 A1 | 8/2009 | Breitwisch et al. |
| 2009/0242865 A1 | 10/2009 | Lung et al. |
| 2011/0049460 A1 | 3/2011 | Breitwisch et al. |

OTHER PUBLICATIONS

U.S. Appl. No. 13/550,091; Non-Final Office Action; Date Filed: Jul. 16, 2012; Date Mailed: Oct. 12, 2012; pp. 1-21.

U.S. Appl. No. 13/102,550; First Office Action; Date Filed: May 6, 2011; Date Mailed: Sep. 17, 2012; pp. 1-37.

Y.N. Hwang et al., "Phase-Change Chalcogenide Nonvolatile RAM Completely Based on CMOS Technology," 2003 International Symposium on VLSI Technology, Systems, and Applicatons (IEEE), Oct. 6-8, 2003. pp. 29-31.

Der-Sheng Chao et al., "Low Programming Current Phase Change Memory Cell with Double GST Thermally Confined Structure", VLSI Technology, 2006, Systems and Applications, 2007, VLSI-TSA 2007, International Symposium on; Apr. 23-25, 2007 pp. 1-2.

S. Raoux et al., "Phase-change random access memory: A scalable technology", IBM J Res. & Dev. vol. 52. Jul./Sep. 4-5, 2008 pp. 465-479.

Song, Y.J. et al, "Advanced ring type contact technology for high density phase change memory", Solid-State Device Research Conference, 2005, ESSDERC 2005, Proceedings of 35th European; Sep. 12-16, 2005 pp. 513-516.

Song, Y.J. et al., "Highly Reliable 256Mb PRAM with Advanced Ring Contact Technology and Novel Encapsulating Technology", VLSI Technology, 2006, Digest of Technical Papers, 2006 Symposium on; pp. 118-119.

Y.C. Chen et al.; "Ultra-Thin Phase-Change Bridge Memory Device Using GeSb;" Electron Device Meeting 2006; pp. 1-3.

Notification of Transmittal of the International Search Report and the Written Opinion of the International Searching Authority, or the Declaration; date of mailing Jan. 10, 2011; PCT/US2010/056174.

International Search Report; International Application No. PCT/EP2010/066131; International Filing Date: Oct. 26, 2010; Date of Mailing: Jan. 19, 2011.

International Search Report—Written Opinion; International Application No. PCT/EP2010/066131; International Filing Date: Oct. 26, 2010; Date of Mailing: Jan. 19, 2011.

M. Breitwisch et al., "Novel Lithography-Independent Pore Phase Change Memory," IEEE Symposium on VLSI Technology, 2007.

B. Rajendran et al., "On the Dynamic Resistance and Reliability of Phase Change Memory," Symposium on VLSI Technology; 2008.

International Search Report; International Application No. PCT/US10/43631; International Filing Date: Jul. 29, 2010; Date of Mailing: Sep. 23, 2010.

International Search Report—Written Opinion—International Application No. PCT/US10/43631; International Filing Date: Jul. 29, 2010; Date of Mailing: Sep. 23, 2010.

Xiu-Lan Cheng et al., "Simulation on A Novel Ga-doped Phase Change Memory for Next Generation Embedded Non-Volatile Memory Application," 2008 IEEE/SEMI Advanced Semiconductor Manufacturing Conference, pp. 43-48.

Anonymous, "Thermal Simulation of Ga3Sb8Te1 Phase Change Memory Cell," Semiconductor Devices and Device Physics Papers, 2010, pp. 1-8.

T. Gille, et al., "Amorphous-crystalline phase transitions in chalcogenide materials for memory applications," Phase Transistions, vol. 81, Issue 7 and 8, Jul. 2008, pp. 773-790.

T. Zhang, et al., "Comparison of the Crystallization of Ge—Sb—Te and Si—Sb—Te in a constant-temperature annealing process," Scripta Materialia, vol. 58, Issue 11, 2008, pp. 977-980.

* cited by examiner

SELF-ALIGNED LOWER BOTTOM ELECTRODE

CROSS-REFERENCE TO RELATED APPLICATION

This application is a divisional of U.S. patent application Ser. No. 12/619,375, filed Nov. 16, 2009, now U.S. Pat. No. 8,129,268, the disclosure of which is incorporated by reference herein in its entirety.

BACKGROUND

The present invention relates generally to semiconductor structures, and more specifically, to a method for fabricating a self-aligned lower bottom electrode for a semiconductor structure which does not require a lithographic masking process, is substantially seam free, and which has minimal topography (i.e., is flat).

A memory cell requires a highly scaled portion of the memory cell to be defined. In one conventional method, a mushroom-type phase change memory cell is formed by first forming a flat lower bottom electrode on which a scaled bottom electrode is formed. The lower bottom electrode may be made by forming a lithography-defined hole, filling the hole with a conductive material and then performing a polishing process to polish the conductive material.

There are several problems associated with the conventional method. These problems include the need for an additional lithography process. The lithography process requires additional costs and may result in an undesirable alignment of the lower bottom electrode.

SUMMARY

According to one embodiment, a method of fabricating a lower bottom electrode for a memory element is provided. The method includes forming a dielectric layer over a semiconductor substrate having a plurality of conductive contacts formed therein to be connected to access circuitry, forming a dielectric cap layer over exposed portions of the dielectric layer and the conductive contacts, depositing a planarizing material over the dielectric cap layer, etching a via to an upper surface of each conductive contact, removing the planarizing material, depositing electrode material over the dielectric cap layer and within the vias, the electrode material contacting an upper surface of each conductive contact, and planarizing the electrode material to form a lower bottom electrode over each conductive contact.

According to another embodiment, a method of fabricating a lower bottom electrode for a memory element is provided. The method includes forming a dielectric layer over a semiconductor substrate having a plurality of conductive contacts formed therein to be connected to access circuitry, forming a dielectric cap layer over exposed portions of the dielectric layer and the conductive contacts, depositing a planarizing material over the dielectric cap layer, etching a via exposing an upper surface and respective side surfaces of each conductive contact along with a portion of an upper surface of the dielectric layer adjacent to the conductive contact, removing the planarizing material, depositing electrode material over the dielectric cap layer and within the vias. The electrode material contacts the upper surface and the respective side surfaces of each conductive contact along with the portion of the upper surface of dielectric layer. The method further includes planarizing the electrode material to form a lower bottom electrode over each conductive contact.

According to another embodiment, a semiconductor structure is provided. The semiconductor structure includes a semiconductor substrate having a dielectric layer formed thereon and conductive contacts formed therein to be connected with access circuitry, a dielectric cap layer formed over exposed portions of the dielectric layer, and a lower bottom electrode formed over each conductive contact. The lower bottom electrode is self-aligned to an upper surface of the conductive contact.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present invention provides a flat lower bottom electrode for a memory element to be included in advanced CMOS technologies, bi-CMOS technologies and SiGe-based technologies. The fabrication of the flat lower bottom electrode 112 (depicted in FIG. 7) will now be described below with reference to FIGS. 1 through 7.

Figure 1:
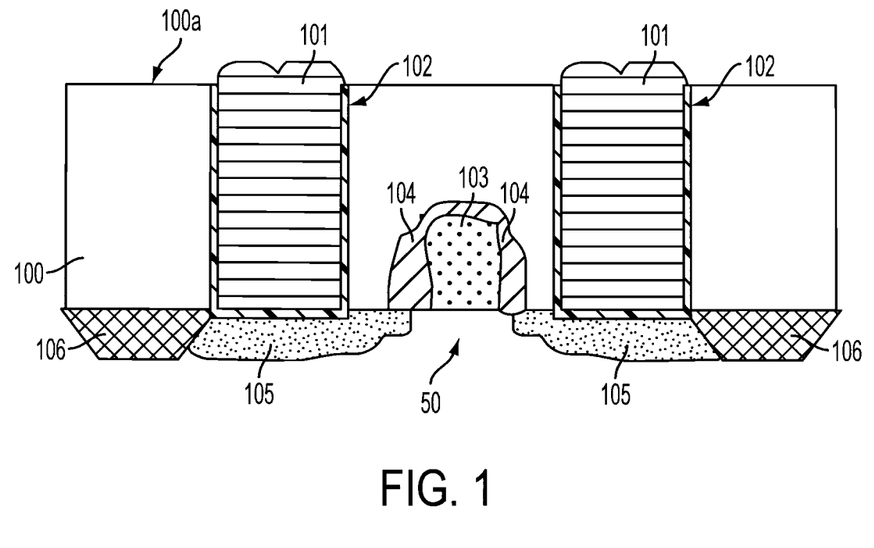
FIG. 1 is a diagram illustrating a semiconductor substrate of a semiconductor structure that can be implemented within embodiments of the present invention.

With reference now to FIG. 1, a diagram illustrating a semiconductor substrate of a semiconductor structure that can be implemented within embodiments of the present invention is provided. As shown in FIG. 1, a substrate 50 having a dielectric layer 100 (e.g., a borophosphosilicate glass (BPSG) dielectric layer) formed thereon is provided. The present invention is not limited to a BPSG type wafer and any suitable type of wafer may be utilized for the purpose set forth herein. A plurality of conductive contacts 101 are formed in the BPSG dielectric layer 100 and surrounded by a liner 102 of titanium nitride, for example, used prior to the deposition of the contact fill, to form the conductive contacts 101. According to an embodiment of the present invention, the conductive contacts 101 may include tungsten (W), or titanium nitride (TiN), or copper (Cu), for example. The conductive contacts 101 are connected to access circuitry (e.g., an access transistor) within the substrate 50. The access transistor includes a gate 103 and spacers 104 adjacent to the sidewalls of the gate 103, and source/drain regions 105. Shallow trench isolation (STI) regions 106 are formed within the substrate 50 to provide electrical isolation between the access transistor and other devices. The conductive contacts 101 connect to the source/drain regions 105. Typically at the top surface 100a of the BPSG dielectric layer 100, the conductive contacts 101 protrude from the surface 100a by about 40 nanometers (nm). However, if the conductive contacts are flushed with the surface 100a, a recessing operation of the BPSG dielectric layer 100 is performed as discussed below with reference to FIG. 2.

Figure 2:
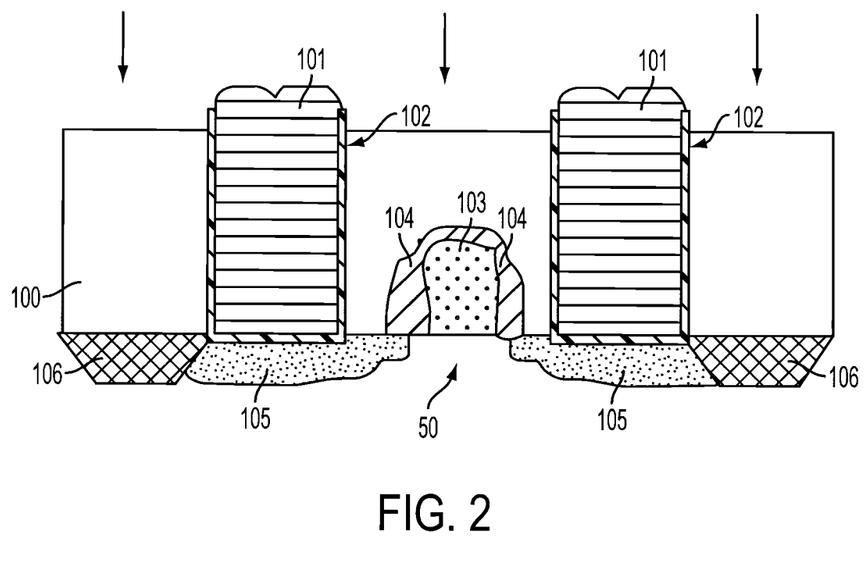
FIG. 2 is a diagram illustrating a recess operation of a dielectric layer formed on the semiconductor substrate that can be implemented within embodiments of the present invention.

FIG. 2 is a diagram illustrating a recessing operation of the BPSG dielectric layer 100 that can be implemented within embodiments of the present invention. When the conductive contact 101 is flush with the surface 100a of the BPSG dielectric layer 100, the BPSG dielectric layer 100 is recessed (as indicated by the arrows shown) using a wet etch operation such as a buffered oxide etch (BOE) or diluted hydrofluoric acid (DHF) so that the conductive contacts 101 protrude over the dielectric layer 100 by about 40 nanometers (nm) to about 60 nanometers (nm).

Figure 3:
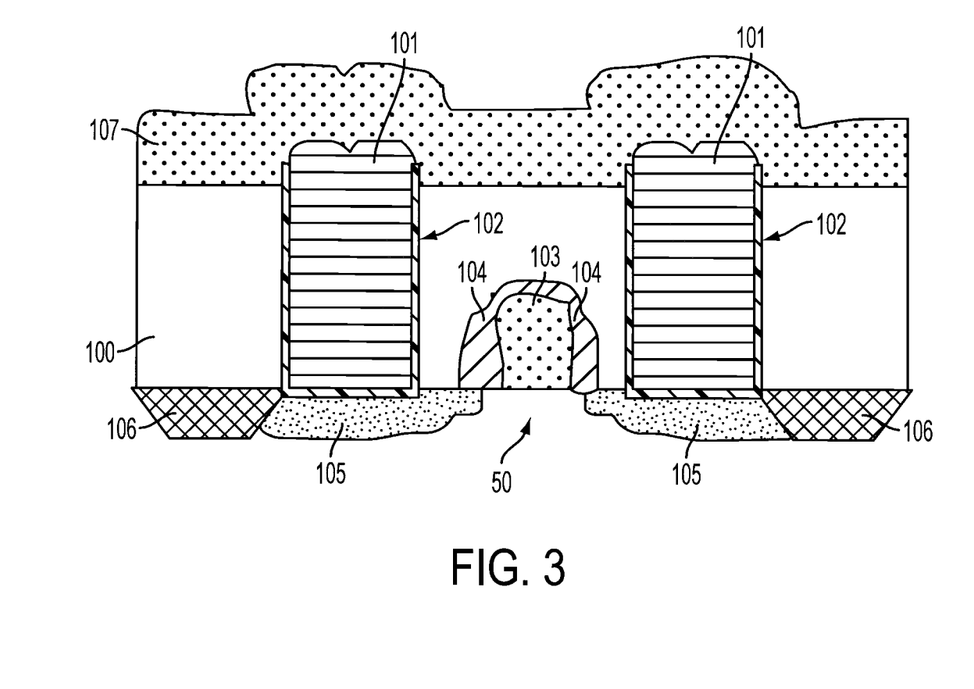
FIG. 3 is a diagram illustrating a deposition operation of a dielectric cap layer that can be implemented within embodiments of the present invention.

FIG. 3 is a diagram illustrating a deposition operation of a dielectric cap layer that can be implemented within embodiments of the present invention. As shown in FIG. 3, a dielectric cap layer 107 is formed over the exposed BPSG dielectric layer 100, the conductive contacts 101 and the exposed liner 102. The dielectric cap layer 107 copies the topology of the underlying layers. The dielectric cap layer 107 is formed of a predetermined thickness ranging from approximately 80 nanometers (nm) to approximately 130 nanometers (nm). The dielectric cap layer 107 may include silicon nitride (SiN) or silicon dioxide ($SiO_2$), for example, however the present invention is not limited hereto. According to one embodiment of the present invention, the dielectric cap layer 107 is formed of silicon nitride processed at a temperature of 400 degrees C. Fabrication processes of a lower bottom electrode will now be described below with reference to FIGS. 4 through 7 below.

Figure 4:
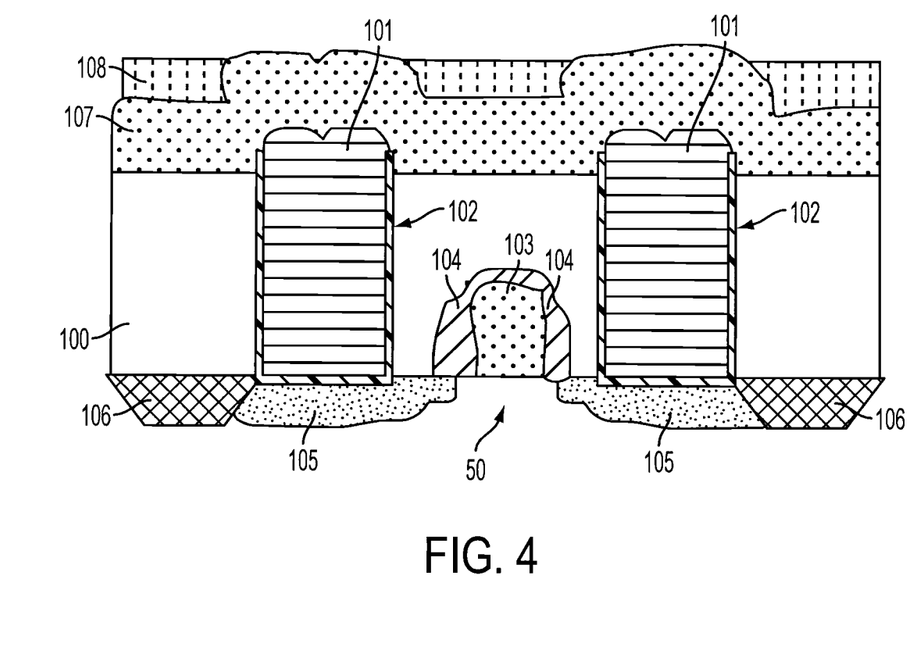
FIG. 4 is a diagram illustrating a deposition of a planarizing material that can be implemented within embodiments of the present invention.

FIG. 4 is a diagram illustrating a deposition of a planarizing material that can be implemented within embodiments of the present invention. In FIG. 4, a planarizing material 108 may be spin on an upper surface of the dielectric cap layer 107. According to an embodiment of the present invention, the planarizing material 108 may be a photo resist layer, an anti-reflective coating (ARC) or a near frictionless carbon (NFC), for example.

Figure 5:
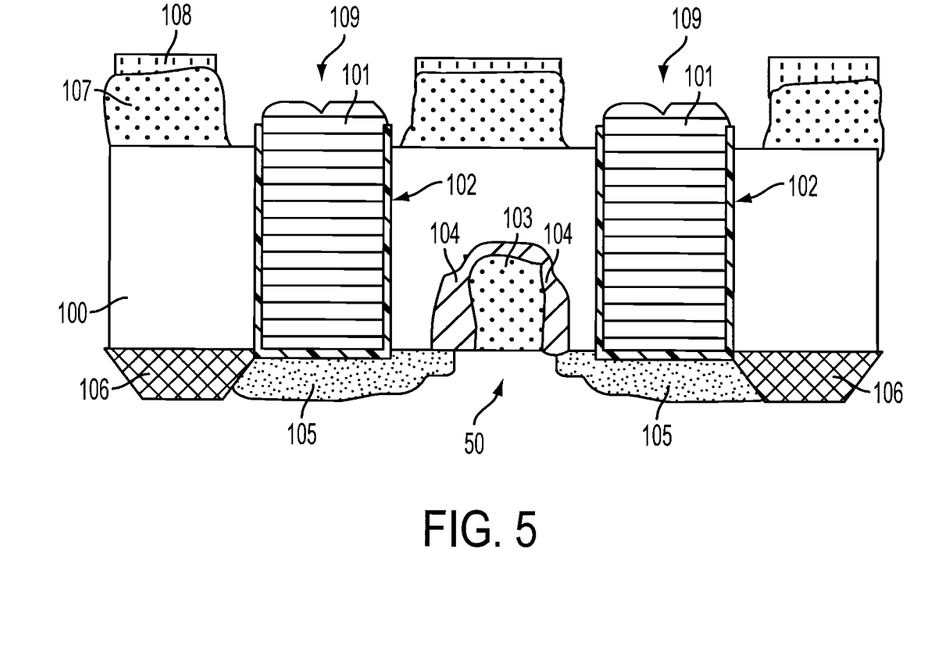
FIG. 5 is a diagram illustrating an etching operation for forming a lower bottom electrode for a memory element that can be implemented within embodiments of the present invention.

FIG. 5 is a diagram illustrating an etching operation for forming a bottom electrode for a memory element that can be implemented within embodiments of the present invention. In FIG. 5, the dielectric cap layer 107 and the planarizing material 108 are etched back by a reactive ion etching (RIE) operation, for example, to remove the layers 107 and 108 from an upper surface of the conductive contacts 101. The etching process forms vias 109 to the upper surface of the conductive contacts 101. According to one embodiment of the present invention, the forming of the via 109 includes etching to expose an upper surface and respective side surfaces of each conductive contact along with a portion of an upper surface of the dielectric layer adjacent to the conductive contact as shown.

Further, a chemical mechanical polishing (CMP) process may be performed to remove any remaining dielectric cap layer 107 from the upper surface of the conductive contacts 101.

Figure 6:
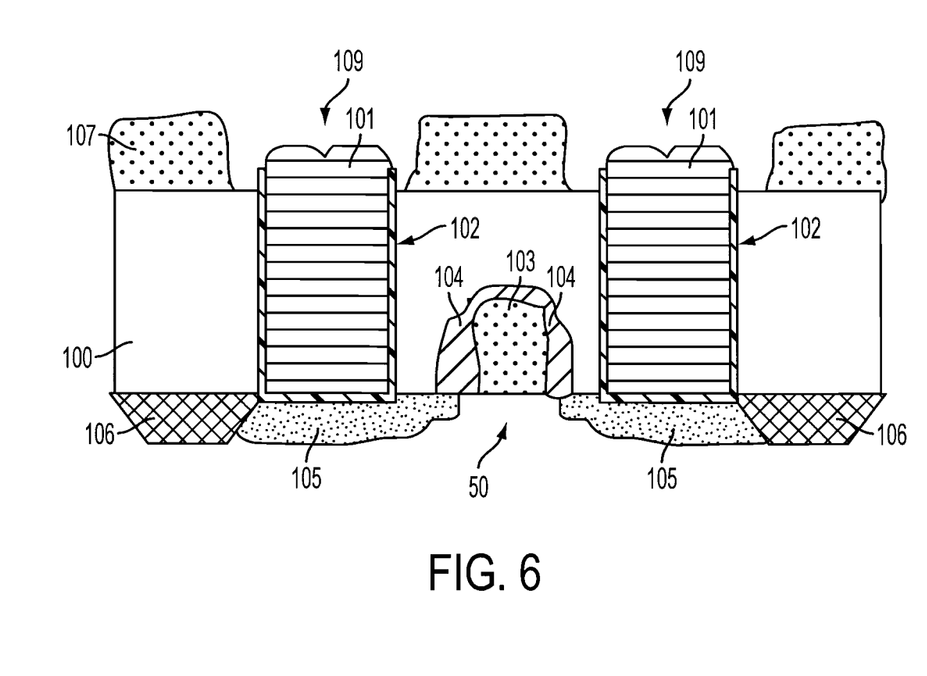
FIG. 6 is a diagram illustrating a removal operation of the planarizing material that can be implemented within embodiments of the present invention.

FIG. 6 is a diagram illustrating is a diagram illustrating a removal operation of the planarizing material that can be implemented within embodiments of the present invention. As shown in FIG. 6, the planarizing material 108 is removed by conventional etching processes. Now, the formation of the bottom electrode will now be described below with reference to FIGS. 7 and 8.

Figure 7:
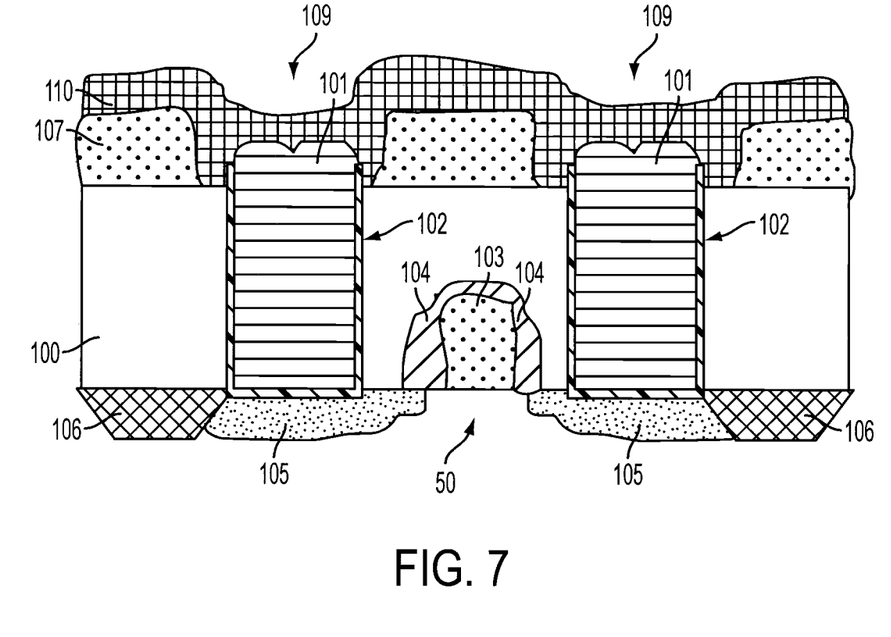
FIG. 7 is a diagram illustrating a deposition operation of electrode material for forming the lower bottom electrode for a memory element that can be implemented within embodiments of the present invention.

FIG. 7 is a diagram illustrating a deposition operation of electrode material for forming a bottom electrode that can be implemented within embodiments of the present invention. As shown in FIG. 7, electrode material 110 is deposited on the dielectric cap layer 107 and within the vias 109. According to an embodiment of the present invention, the electrode material 110 may include chemical vapor deposition (CVD) titanium nitride (TiN), tungsten (W), silicon (Si), tantalum nitride (TaN), ruthenium (Ru) or any suitable conductive material.

Figure 8:
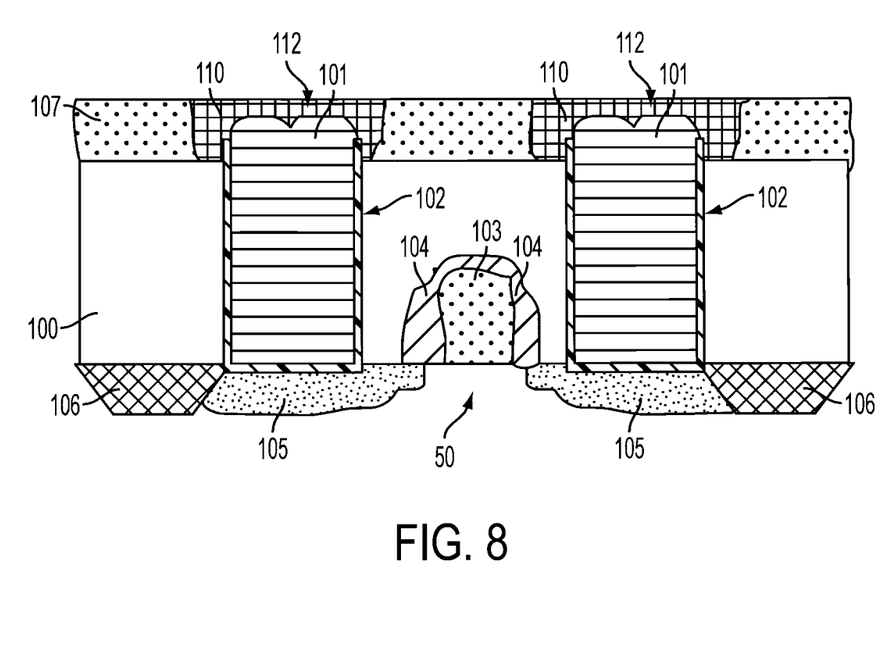
FIG. 8 is a diagram illustrating a lower bottom electrode that can be implemented within embodiments of the present invention.

FIG. 8 is a diagram illustrating a planarization operation of the electrode material forming a lower bottom electrode that can be implemented within embodiments of the present invention. As shown in FIG. 8, the electrode material 110 is planarized using a chemical mechanical polishing (CMP) process, to form a lower bottom electrode 112 over each conductive contact 101. According to an embodiment of the present invention, the lower bottom electrode 112 is self-aligned with the upper surface of the conductive contact 101. In one embodiment of the present invention, the dielectric cap layer 107 acts as a CMP stop layer. The electrode material 110 is of a predetermined thickness over the conductive contact 101. According to one embodiment of the present invention, the predetermined thickness ranges from about 10 nanometers (nm) to approximately 50 nanometers (nm). According to one embodiment of the present invention, the electrode material 110 contacts the upper surface and the respective side surfaces of each conductive contact 101. The electrode material 110 which is formed along the respective side surfaces of the conductive contacts 101 is a predetermined width ranging from approximately 5 nanometers (nm) to approximately 50 nanometers (nm).

Embodiments of the present invention provide a method of fabricating a maskless, flat lower bottom electrode in a semiconductor structure. Therefore, the present invention provides the advantages of minimizing the number of masking levels and in turn minimizing associated processing costs.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
   a semiconductor substrate having a dielectric layer formed thereon and conductive contacts formed therein to be connected with access circuitry, the conductive contacts including a conductive material surrounded by a liner material which protrude over a top surface of the dielectric layer;
   a dielectric cap layer formed over exposed portions of the dielectric layer;
   a lower bottom electrode formed over each conductive contact, wherein the lower bottom electrode is self-aligned to an upper surface of the conductive contact such that a bottom surface of the lower bottom electrode is at a same level as a bottom surface of the dielectric cap layer, such that the bottom surface of the lower bottom electrode is co-planar with the bottom surface of the dielectric cap layer; and
   wherein the lower bottom electrode is in contact with exposed side surfaces of the conductive material and liner material which protrude over the top surface of the dielectric layer.

2. The semiconductor structure of claim 1, wherein the conductive contacts protrude over the dielectric layer approximately 40 nanometers (nm) to approximately 60 nanometers (nm).

3. The semiconductor structure of claim 1, wherein the dielectric cap layer is formed of a predetermined thickness ranging from approximately 80 nanometers (nm) to approximately 130 nanometers (nm).

4. The semiconductor structure of claim 1, wherein the lower bottom electrode is a predetermined thickness above each conductive contact, wherein the predetermined thickness ranges from approximately 10 nanometers (nm) to approximately 50 nanometers (nm).

5. The semiconductor structure of claim 1, wherein the lower bottom electrode is formed of an electrode material comprising one of chemical vapor deposition (CVD) titanium nitride (TiN), tungsten (W) or silicon (Si), tantalum nitride (TaN), or ruthenium (Ru).

* * * * *